(12) United States Patent
Huang

(10) Patent No.: US 7,641,297 B2
(45) Date of Patent: Jan. 5, 2010

(54) RACK MOUNTABLE TO A COMPUTER CABINET WITHOUT USING A TOOL

(75) Inventor: Kuo-Sheng Huang, Taipei County (TW)

(73) Assignee: Nan Juen International Co., Ltd., Taipei County (TW)

(*) Notice: Subject to any disclaimer, the term of this patent is extended or adjusted under 35 U.S.C. 154(b) by 444 days.

(21) Appl. No.: 11/639,267

(22) Filed: Dec. 15, 2006

(65) Prior Publication Data
US 2008/0143224 A1 Jun. 19, 2008

(51) Int. Cl.
*A47B 97/00* (2006.01)
(52) U.S. Cl. ............................ 312/334.4; 211/26
(58) Field of Classification Search ............ 312/330.1, 312/334.1, 334.4, 334.7, 334.8, 334.11, 265.1, 312/333, 334.22, 265.4, 350; 211/26, 175, 211/192, 189; 361/679.01, 679.02; 248/219.1, 248/221.11, 243, 244, 298.1
See application file for complete search history.

(56) References Cited

U.S. PATENT DOCUMENTS

| | | | | | |
|---|---|---|---|---|---|
| 977,609 | A | * | 12/1910 | Freeman | 248/243 |
| 3,697,034 | A | * | 10/1972 | Shell | 248/243 |
| 5,063,715 | A | * | 11/1991 | Goodman | 52/36.6 |
| 6,422,399 | B1 | * | 7/2002 | Castillo et al. | 211/26 |
| 6,431,668 | B1 | * | 8/2002 | Reddicliffe | 312/334.5 |
| 6,659,577 | B2 | * | 12/2003 | Lauchner | 312/334.5 |
| 6,773,080 | B2 | * | 8/2004 | Chen et al. | 312/265.1 |
| 6,840,388 | B2 | * | 1/2005 | Mayer | 211/26 |
| 6,871,920 | B2 | * | 3/2005 | Greenwald et al. | 312/334.4 |
| 6,929,339 | B1 | * | 8/2005 | Greenwald et al. | 312/334.4 |
| 7,144,184 | B1 | * | 12/2006 | Tsai | 403/350 |
| 7,281,633 | B2 | * | 10/2007 | Hartman et al. | 211/26 |
| 7,494,101 | B2 | * | 2/2009 | Chen | 248/298.1 |
| 2003/0136749 | A1 | * | 7/2003 | Williams et al. | 211/26 |
| 2005/0156493 | A1 | * | 7/2005 | Yang et al. | 312/334.5 |

* cited by examiner

*Primary Examiner*—James O Hansen
(74) *Attorney, Agent, or Firm*—Muncy, Geissler, Olds & Lowe, PLLC

(57) ABSTRACT

The present invention discloses a rack mountable to a computer cabinet without using a tool, and the rack includes a slide module and a latch element, and the slide module includes an adjusting element and a latch element. The latch element includes at least one hook extended horizontally and at least one protruding pillar proximate to the hook. During installation, the hook is latched into a positioning hole of the computer cabinet, and a turning member of the latch element is turned to extend the protruding pillar deep into the positioning hole, so that the hook will not be separated from the positioning hole when the protruding pillar is pressed. On the other hand, users simply need to return the turning member to its original position to separate the protruding pillar from the positioning hole, so as to disassemble the rack.

9 Claims, 7 Drawing Sheets

RACK MOUNTABLE TO A COMPUTER CABINET WITHOUT USING A TOOL

BACKGROUND OF THE INVENTION

1. Field of the Invention

The present invention relates to a rack mountable to a computer cabinet without using a tool, and more particularly to a rack having a slide module that can be secured into a computer cabinet without using any tool, and the length of the rack can be adjusted by moving adjusting elements on the slide module to fit computer cabinets with different depths.

2. Description of the Related Art

As networking technology advances, personal computers become very popular, and servers are also used extensively in offices and for big events. In general, a server is used as a contact window for coordination or a central data collecting area, servers are centralized and placed into a computer cabinet. The front of the computer cabinet usually has an opening for placing the servers into the computer cabinet. Both lateral sides of the opening of the computer cabinet comes with a separate stand 100 as shown in FIG. 1, and the stands 100 include separate longitudinally arranged pivotal connecting holes 101 disposed on a rack 200 of the stands 100, and the rack 200 is provided for a slide module (not shown in the figure), and the slide module installs a computer chassis (not shown in the figure). Further, both front and rear ends of the rack 200 have an inwardly bent plate 201, and the bent plates 201 separately have a fixing hole 202 for passing a screw bolt 203, and the screw bolt 203 is passed through the fixing hole 202 and screwed into a fixing member 204 of the pivotal connecting hole 101, so that the fixing hole 202, screw bolt 203 and fixing member 204 fix the rack 200 onto the stand 100. However, it is necessary to use a tool to secure screw bolts 203 into the fixing member 204 of the rack 200, and thus the installation and removal of the rack is very troublesome and time-consuming. Furthermore, the rack 200 comes with a fixed length and it is made according to the depth of the computer cabinet, and thus it is necessary to prepare a new computer cabinet for the requirement of a different depth, and such application definitely cannot meet the user's requirements.

SUMMARY OF THE INVENTION

In view of the shortcomings of the conventional apparatus and structure, the inventor of the present invention based on years of experience in the related industry to conduct extensive researches and experiments, and finally developed a rack mountable to a computer cabinet without using a tool in accordance with the present invention.

Therefore, it is a primary objective of the present invention to provide a rack mountable to a computer cabinet without using a tool, wherein a latch element of the rack can be used for installing or disassembling the computer cabinet quickly.

Another objective of the present invention is to provide a rack mountable to a computer cabinet without using a tool, and the rack is installed inside the computer cabinet, and panels on both lateral sides of the computer cabinet separately have a vertically arranged positioning hole to be latched by a latch element. The latch element is fixed at a distal edge of the slide module and has a base, and a lateral surface of the base includes at least one hook extended horizontally, and the base contains an embedding body, and a lateral side of the embedding body has a protruding pillar attached to the hook, and a braking member is included between the embedding body and the base, and the braking member is pivotally connected to an axle rod disposed at a position other than the central position of the braking member. The braking member keeps an appropriate distance from the bottom of the base. For installation, a movable turning member is disposed at an end of the braking member away from the axle rod, and the hook is latched into the positioning hole of the computer cabinet first, and the turning member is turned eccentrically and pressed onto the embedding body to drive the embedding body to move accordingly, such that the protruding pillar can be extended all the way into the positioning hole, and the hook is pressed by the protruding pillar, and the hook will not be separated from the positioning hole. On the other hand, the turning member is returned to its original position for disassembling the rack, so as to move the embedding body accordingly, and separate the protruding pillar from the positioning hole. The invention can achieve the effect of mounting the rack onto the computer cabinet without using any tool.

A further objective of the present invention is to provide a rack mountable to a computer cabinet without using a tool, and a lateral surface at a distal edge of the slide module includes an adjusting element, a latch element fixed on the adjusting element and disposed on a surface without the slide module, and the adjusting element has a slide slot, and a screw bolt is passed through the slide slot, and secured into a screw hole on the surface of the slide module by a screw bolt, so that the adjusting element is limited by the slide slot to slide back and forth in the slide module for adjusting the length of the slide module.

BRIEF DESCRIPTION OF THE DRAWINGS

To make it easier for our examiner to understand the objective, shape, structure, device, characteristics and performance of the present invention, the following embodiment accompanied with the related drawings are described in details.

DETAILED DESCRIPTION OF THE PREFERRED EMBODIMENTS

Figure 1:
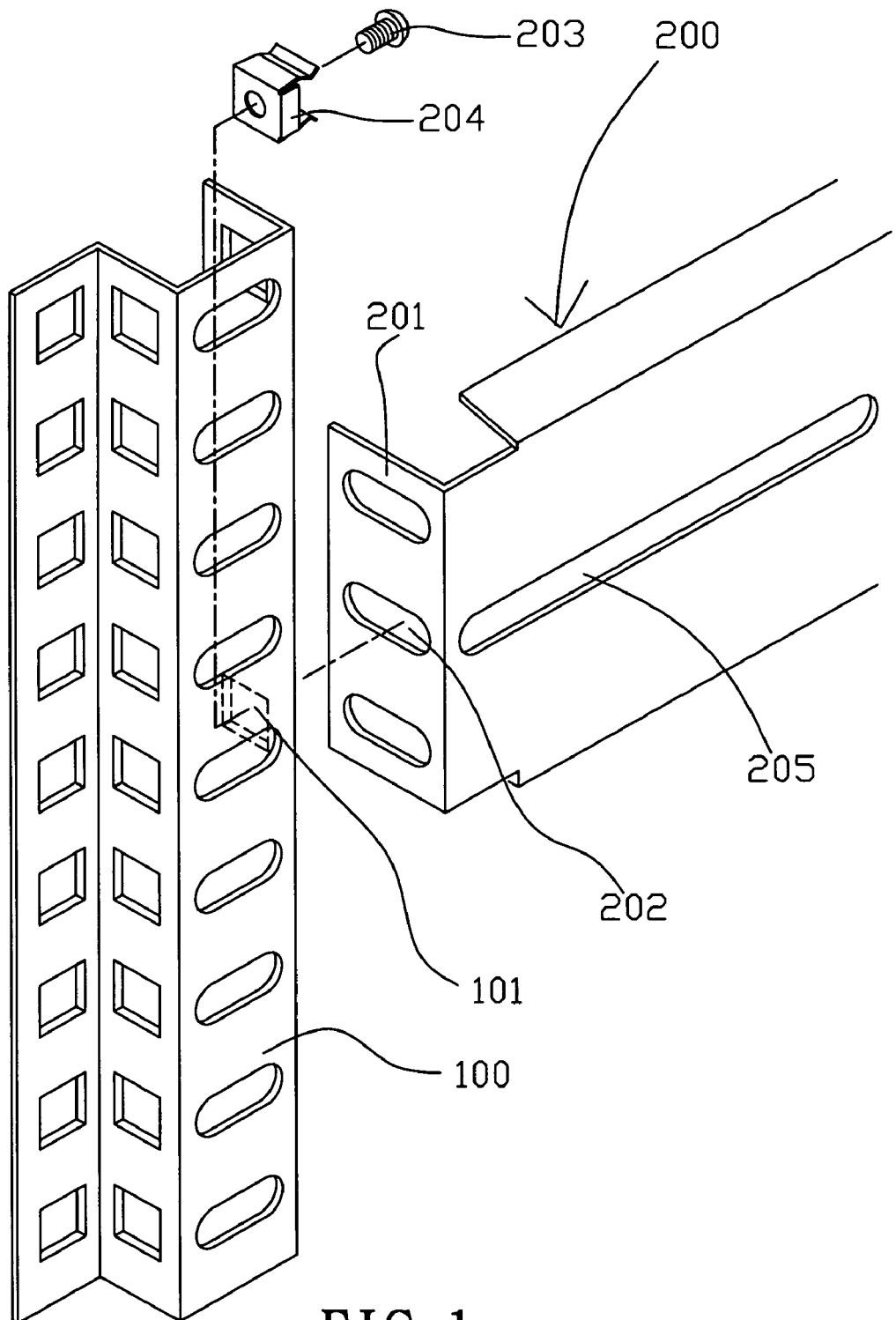
FIG. 1 is a schematic view of a conventional apparatus.
Figure 2:
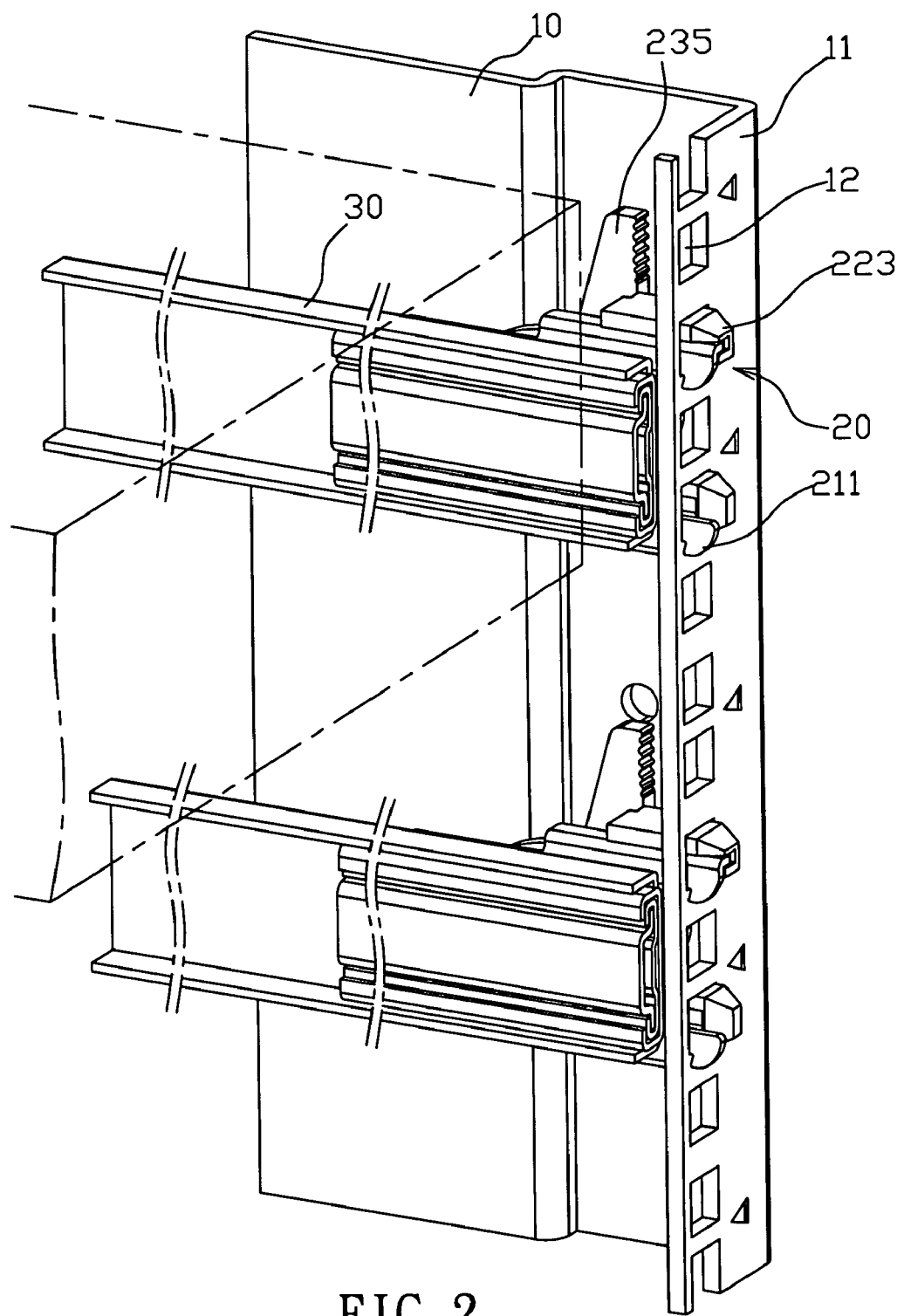
FIG. 2 is a perspective view of a rack mounted onto a computer cabinet of the present invention.

Referring to FIG. 2 for a rack mountable to a computer cabinet without using a tool in accordance with the present invention, the rack is mounted into a computer cabinet (not shown in the figure), and the computer cabinet of this embodiment is a frame having an opening, and both lateral sides of the computer cabinet separately have a side panel 10, and the side panels 10 have a panel 11 extended towards the opening of the computer cabinet, and the panels 11 separately have a vertically arranged positioning hole 12.

Figure 3:
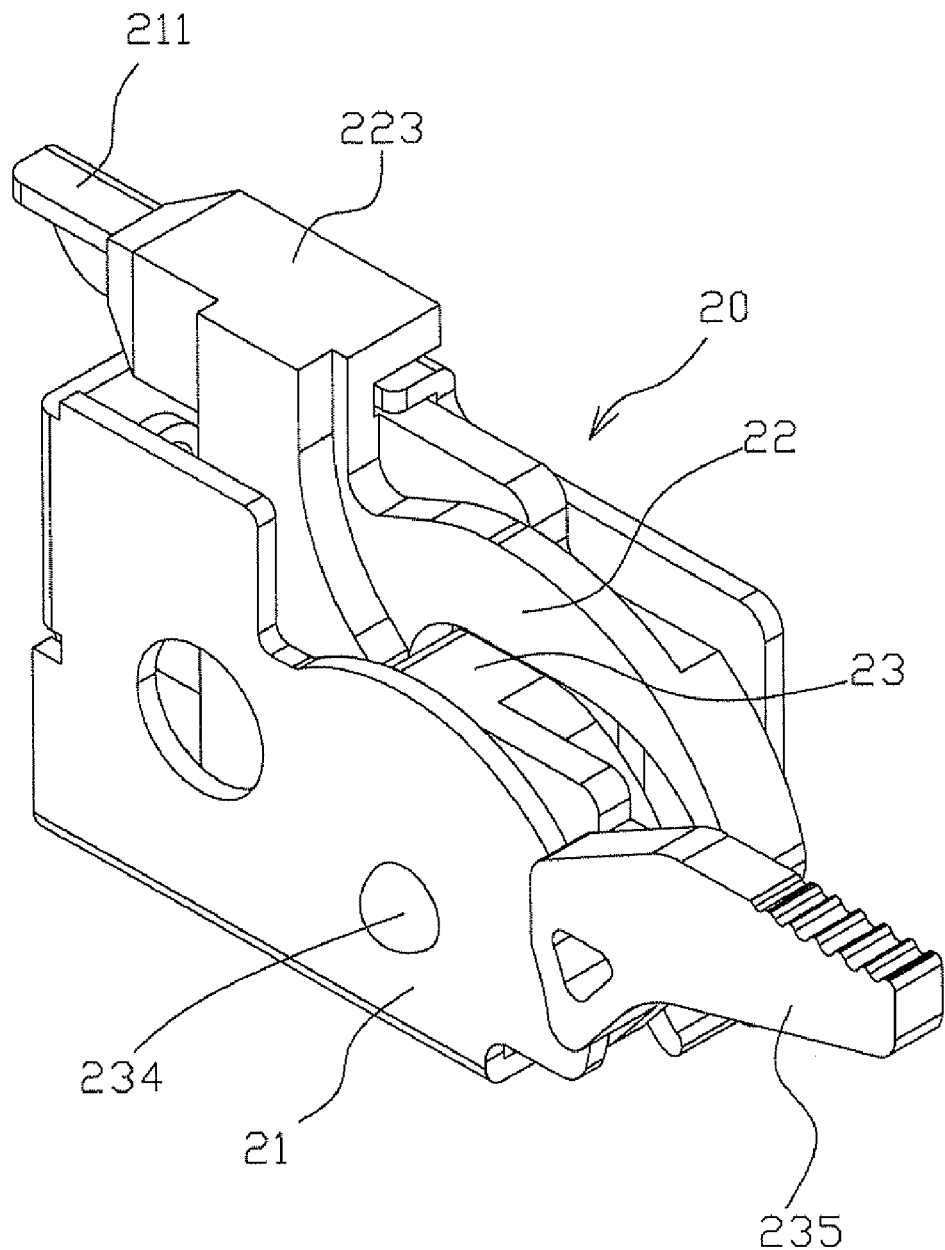
FIG. 3 is a perspective view of a latch element of the present invention.
Figure 3A:
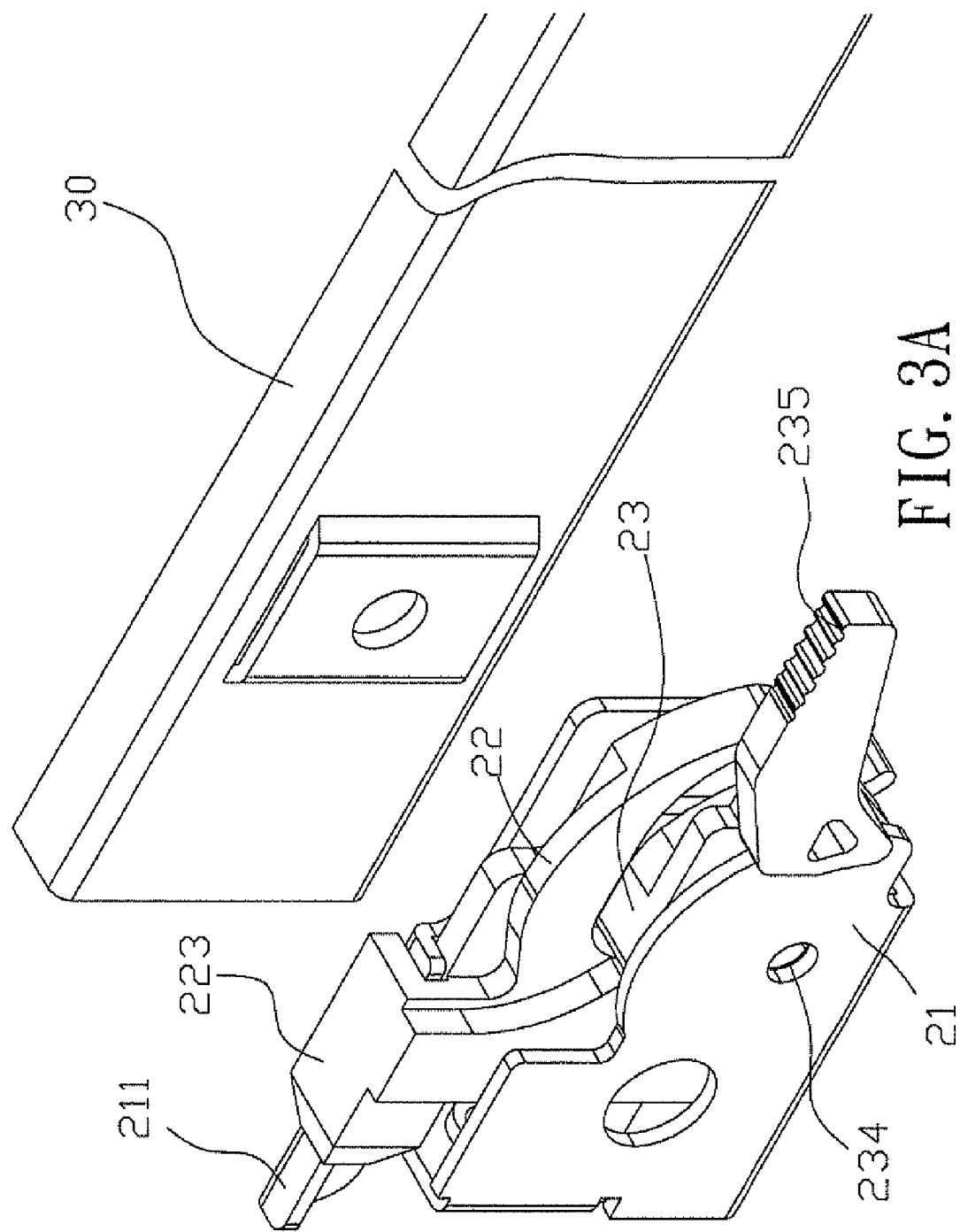
FIG. 3A is a perspective view of connecting a latch element with a slide module in accordance with the present invention.
Figure 4:
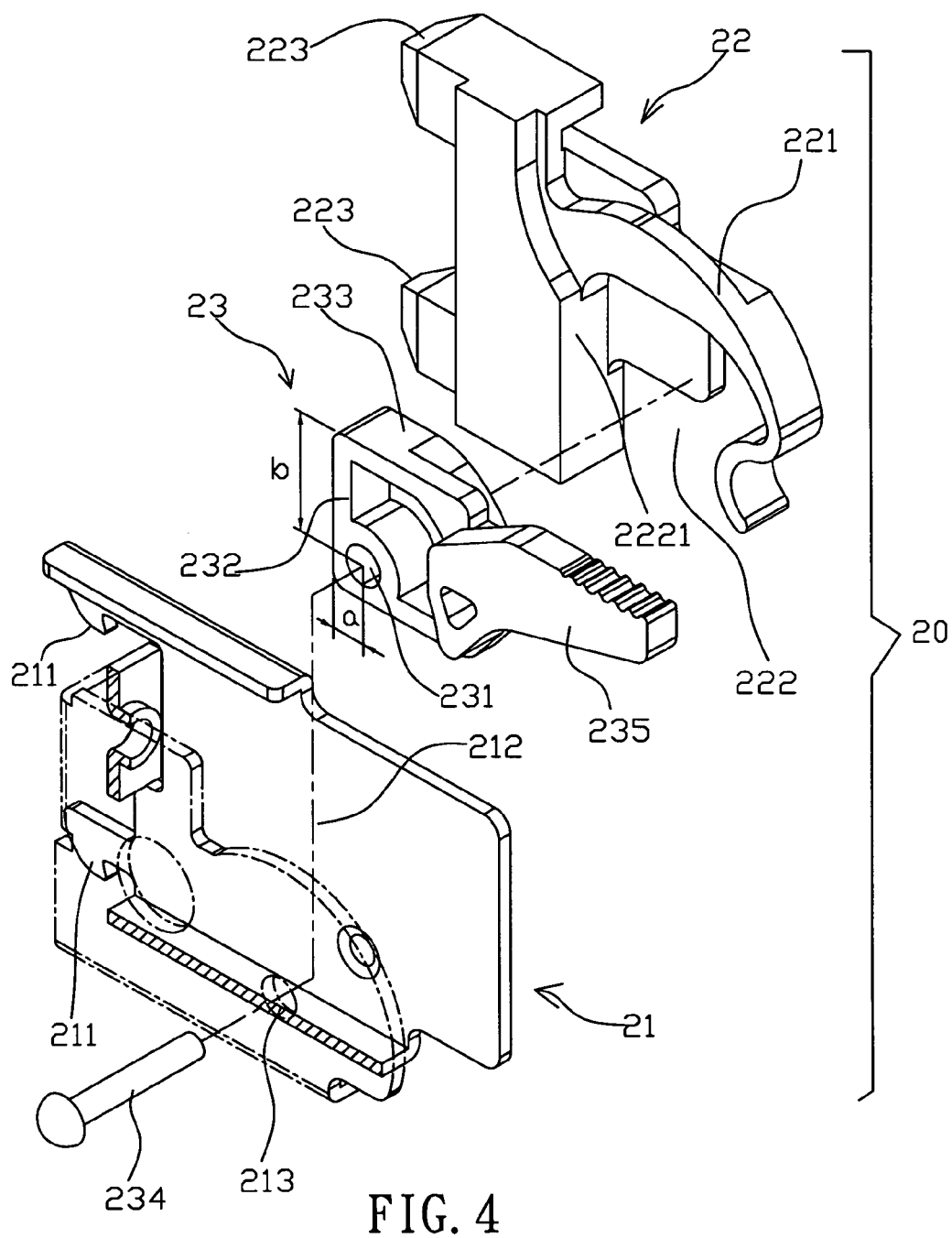
FIG. 4 is an exploded view of a latch element of the present invention.

Referring to FIGS. 2, 3, 3A and 4, the rack mountable to a computer cabinet without using a tool in accordance with the present invention comprises a latch element 20 and a slide module 30, and the latch element 20 is installed at a distal edge of the slide module 30; wherein the latch element 20 is latched into a positioning hole 12. The latch element 20 includes a base 21, and a lateral surface of the base 21 is fixed onto a lateral surface at an end of the slide module 30 (as shown in FIG. 3A), and another lateral surface of the base 21 includes at least one hook 211 extended horizontally (wherein this embodiment adopts upper and lower hooks 211 disposed on the same lateral surface of the base 21), and the base 21 has a containing groove 212 for containing an embedding body 22, and the embedding body 22 has a limit element 221 bent towards the bottom of the base 21. The limit element 221 and the bottom of the base 21 form a recession 222 at a height lower than the embedding body 22. Further, the embedding body 22 has at least one protruding pillar 223 disposed on a lateral surface away from the recession 222 (wherein this embodiment has two protruding pillars 223), and the protruding pillar 223 is proximate to the hook 211, and the recession 222 contains a braking member 23, and the braking member 23 has a pivotal connecting hole 231 disposed at a position other than the central position of the braking member 23. The distances of the pivotal connecting hole 231 from the near lateral surface 232 and the far top surface 233 are equal to a and b respectively, and a is smaller than b (as shown in FIG. 4). An axle rod 234 is passed through the pivotal connecting hole 231 by means of a hole 213 on the base 21 and pivotally connected with the base 21, and the braking member 23 keeps an appropriate distance from the bottom of the base 21. Further, an end of the braking member 23 away from the pivotal connecting hole 231 is pivotally connected to a turning member 235, and the turning member 235 can be turned forward or backward to eccentrically turn the braking member 23 by using the axle rod 234 as the center to turn the turning member 235 from the lateral surface 232 to the top surface 233 to press on a lateral surface 2221 of the recession 222 of the embedding body 22, and drive the embedding body 22 to move accordingly.

Figure 5A:
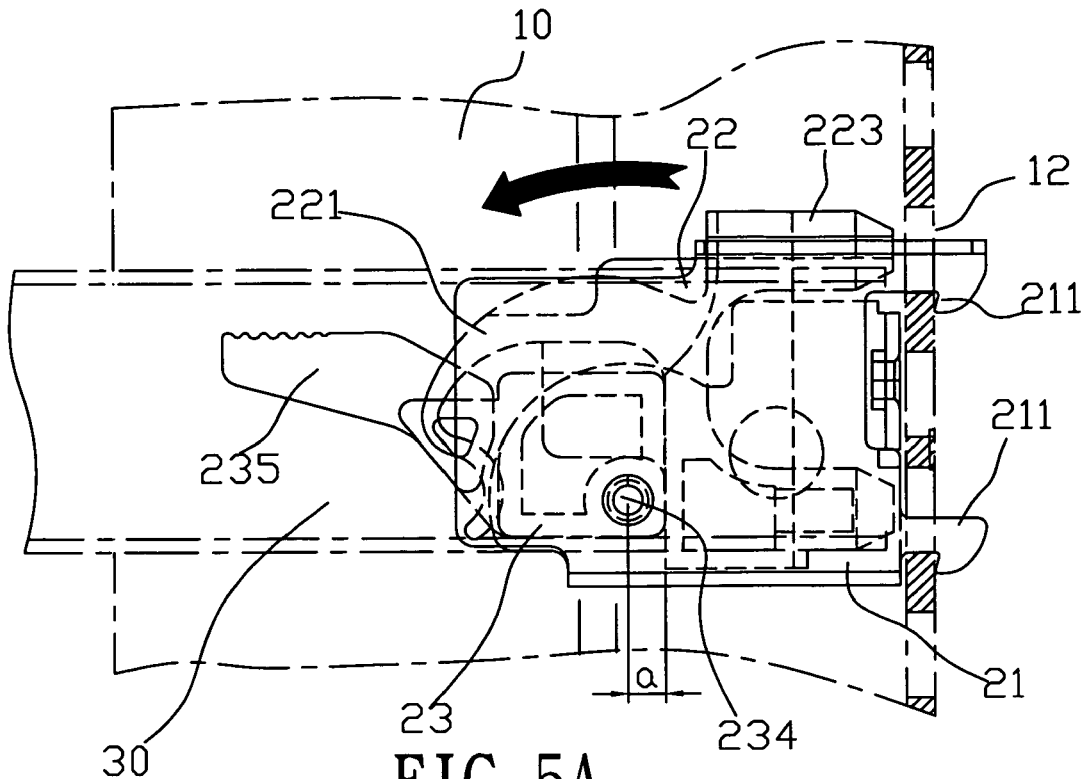
FIG. 5A is a schematic view of separating a protruding pillar from a positioning hole of a computer cabinet in accordance with the present invention.
Figure 5B:
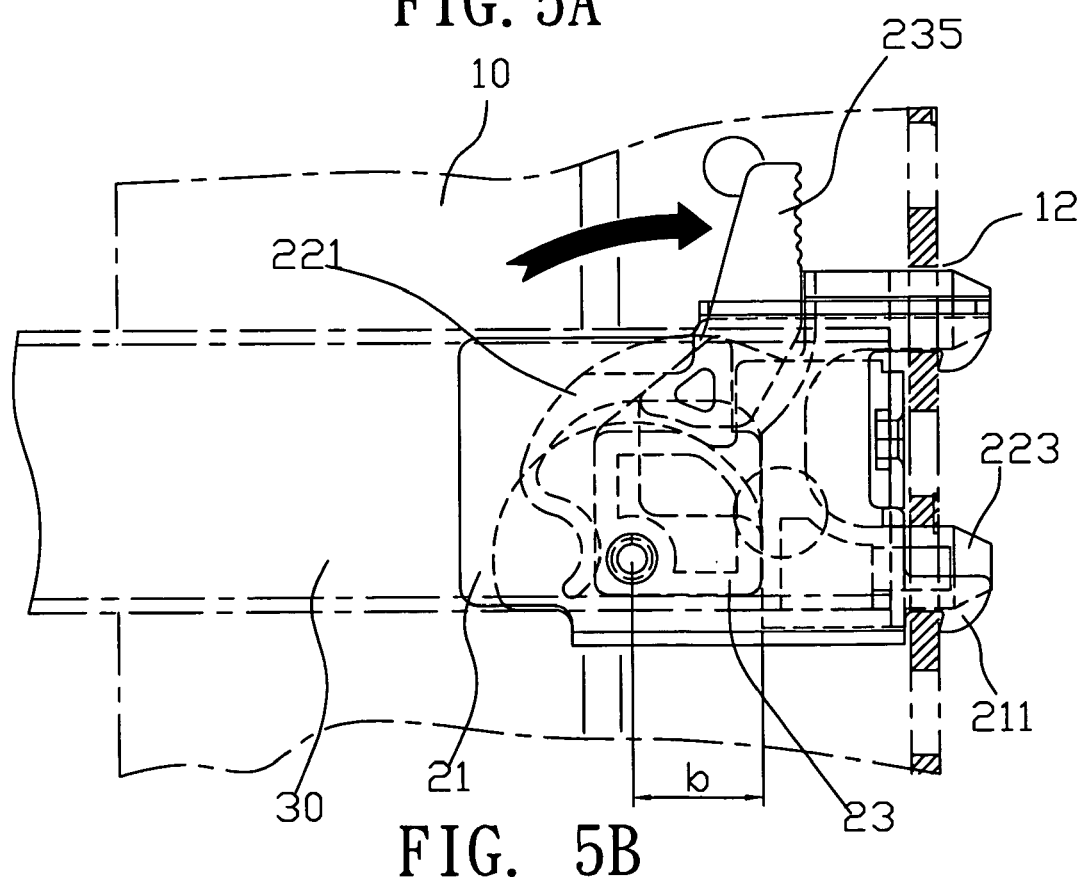
FIG. 5B is a schematic view of passing a protruding pillar from a positioning hole of a computer cabinet in accordance with the present invention.

Referring to FIGS. 5A and 5B for the installation, the latch element 20 and the slide module 30 are fixed together, and the hook 211 on the base 21 is latched into the positioning hole 12 of the computer cabinet, and the turning member 235 is turned from a position away from the braking member 23 towards the braking member 23. The turning member 235 is turned to eccentrically rotate the axle rod 234 around the braking member 23, so that the embedding body 22 is moved to extend the protruding pillar 223 on the embedding body 22 all the way into the positioning hole 12, such that the hook 211 is pressed by the protruding pillar 223 and will not be separated from the positioning hole 12 (as shown in FIG. 5B). On the other hand, the turning member 235 is returned to its original position for disassembling the rack, so that the braking member 23 is pressed on the internal lateral surface 2221 of the limit element 221 to drive the embedding body 22 to move accordingly, and the protruding pillar 223 will be separated from the positioning hole 12 to separate the latch element 20 from the computer cabinet, so as to achieve the effect of installing and disassembling a rack without using any tool.

Figure 6:
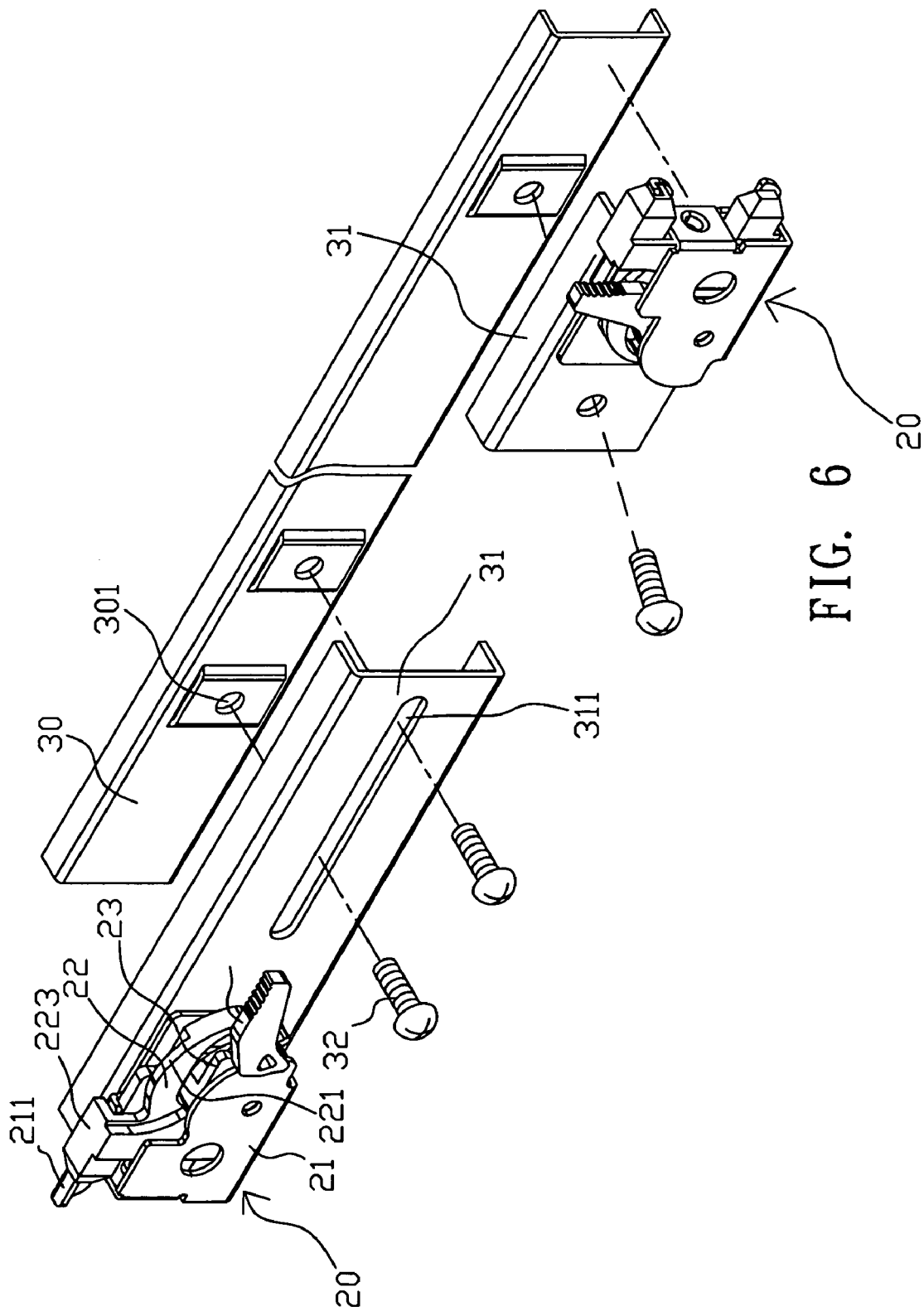
FIG. 6 is a schematic view of a latch element and a slide module in accordance with another preferred embodiment of the present invention.

Referring to FIG. 6 for another preferred embodiment of the present invention, a lateral surface at a distal edge of the slide module 30 has an adjusting element 31, a latch element 20, fixed on a surface of the adjusting element 31 without the slide module 30, and the adjusting element 31 has a slide slot 311 for passing a screw bolt 32, and the screw bolt 32 is secured into a screw hole 301 on the surface of the slide module 30. The adjusting element 31 is limited by the slide slot 311 and can be slid back and forth in the slide module 31 for adjusting the length of the slide module 30.

Referring to FIGS. 5A, 5B and 6 for installing the rack, the latch element 20 and the adjusting element 31 are fixed together, and the length of the support element is adjusted by the adjusting element 31 according to the depth of the computer cabinet, and the hook 211 on the base 21 is latched into the positioning hole 12 of the hook 211 of the computer cabinet and the turning member 235 is turned from a position away from the braking member 23 towards the braking member 23. The turning member 235 is turned to eccentrically rotate the braking member 23 around the axle rod 234, so that the embedding body 22 is moved to extend the protruding pillar 223 on the embedding body 22 all the way into the positioning hole 12, and the protruding pillar 223 is pressed by the hook 211 to prevent the protruding pillar 223 from separating from the positioning hole 12 (as shown in FIG. 5B). On the other hand, the turning member 235 is returned to its original position to disassemble the rack, and the braking member 23 will press the internal lateral surface of the limit element 221 to drive the embedding body 22 to move accordingly, such that the protruding pillar 223 will be separated from the positioning hole 12, and the latch element 20 will be separated from the computer cabinet, so as to achieve the effect of installing and disassembling a rack without using any tool.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation, the present invention enhances the performance than the conventional structure and further complies with the patent application requirements and is duly filed for the patent application.

What is claimed is:

1. A rack mountable to a computer cabinet without using a tool, said rack being fixed inside said computer cabinet, the computer cabinet including at least one positioning hole, said rack comprising:

a slide module, installed on a lateral surface of said computer cabinet;

a latch element, comprising:

a base, fixed on a lateral surface at an end of said slide module, and having at least one hook disposed on a lateral surface of said base;

an embedding body, contained in said base, and having a limit element bent towards a bottom of said base, such that said limit element and the bottom of said base form a recess, and at least one protruding pillar disposed on said embedding body and proximate to said at least one hook;

a braking member, included between said base and said embedding body, and having a pivotal connecting hole disposed at a position other than the center of said braking member, and an axle rod passing through said pivotal connecting hole and pivotally coupled with said base, such that said braking member maintains an appropriate distance from the bottom of said base, and said braking member is extended into said recess of said embedding body, a movable turning member being pivotally coupled to said braking member and disposed at an end of the braking member away from said pivotal connecting hole;

thereby, said at least one hook is latched into the positioning hole of said computer cabinet, and said turning member is turned eccentrically by using said axle rod as a center and pressed on a lateral surface in said recess, and said at least one protruding pillar is extended into said positioning hole to press against the at least one hook of the base to prevent the at least one hook from separating from said positioning hole, and on the other hand, if said rack is disassembled, said turning member is returned to its original position, so that said braking member is pressed on a lateral surface inside said limit element, and said embedding body is moved accordingly to separate said at least one protruding pillar from said positioning hole, so as to achieve mounting and disassembling said rack without using a tool.

2. The rack mountable to a computer cabinet without using a tool as recited in claim 1, wherein the at least one hook of the base comprises two hooks.

3. The rack mountable to a computer cabinet without using a tool as recited in claim 1, wherein the at least one protruding pillar comprises two protruding pillars.

4. The rack mountable to a computer cabinet without using a tool as recited in claim 1, wherein the base includes a containing groove, for containing the embedding body and the braking member.

5. A rack mountable to a computer cabinet without using a tool, said rack being fixed in said computer cabinet, the computer cabinet including at least one positioning hole, said rack comprising:

a slide module, installed on a lateral surface of said computer cabinet, and having an adjusting element disposed on a lateral surface at a distal end of said slide module, and a slide slot disposed on said adjusting element;

a latch element, comprising:

a base, fixed on a lateral surface of the adjusting element, and having at least one hook disposed on a lateral surface of said base;

an embedding body, contained in said base, and having a limit element bent towards a bottom of said base, such that said limit element and the bottom of said base form a recess, and at least one protruding pillar disposed on said embedding body and proximate to said at least one hook;

a braking member, included between said base and said embedding body, and having a pivotal connecting hole disposed at a position other than the center of said braking member, and an axle rod passing through said pivotal connecting hole and pivotally coupled with said base, such that said braking member maintains an appropriate distance from the bottom of said base, and said braking member is extended into said recess of said embedding body, a movable turning member being pivotally coupled to said braking member and disposed at an end of the braking member away from said pivotal connecting hole;

thereby, said latch element is fixed to said adjusting element, and said at least one hook is latched into the positioning hole of said computer cabinet, and said turning member is turned eccentrically by using said axle rod as a center and pressed on a lateral surface in said recession, and said at least one protruding pillar is extended into said positioning hole to press against the at least one hook of the base to prevent the at least one hook from separating from said positioning hole, and on the other hand, if said rack is disassembled, said turning member is returned to its original position, so that said braking member is pressed on a lateral surface inside said limit element, and said embedding body is moved accordingly to separate said at least one protruding pillar from said positioning hole, so as to achieve mounting and disassembling said rack without using a tool, and said slide slot of said adjusting element is limited, such that the length of said slide module can be adjusted by sliding said slide module forward or backward.

6. The rack mountable to a computer cabinet without using a tool as recited in claim 5, wherein the at least one hook of the base comprises two hooks.

7. The rack mountable to a computer cabinet without using a tool as recited in claim 5, wherein the slide slot receives a screw bolt, and said screw bolt is secured into a screw hole on the surface of the slide module.

8. The rack mountable to a computer cabinet without using a tool as recited in claim 5, wherein the at least one protruding pillar comprises two protruding pillars.

9. The rack mountable to a computer cabinet without using a tool as recited in claim 5, wherein the base includes a containing groove, for containing the embedding body and the braking member.

\* \* \* \* \*